United States Patent [19]

Arakawa

[11] 4,045,753
[45] Aug. 30, 1977

[54] CERAMIC FILTER
[75] Inventor: Koji Arakawa, Kawagoe, Japan
[73] Assignee: Toko, Inc., Tokyo, Japan
[21] Appl. No.: 681,486
[22] Filed: Apr. 29, 1976
[30] Foreign Application Priority Data
  May 9, 1975  Japan ................................ 50-65008
  May 13, 1975 Japan ................................ 50-56935
[51] Int. Cl.[2] ...................... H03H 9/26; H03H 9/32; H03H 9/20
[52] U.S. Cl. ..................................................... 333/72
[58] Field of Search .................................. 333/71, 72; 310/8-9.8

[56] References Cited
U.S. PATENT DOCUMENTS

| 2,459,019 | 1/1949 | D'Heedene | 333/72 |
| 3,676,724 | 7/1972 | Berlincourt et al. | 333/72 X |
| 3,676,806 | 7/1972 | Orchard et al. | 333/72 |

Primary Examiner—Alfred E. Smith
Assistant Examiner—Marvin Nussbaum

[57] ABSTRACT

A ceramic filter comprising a plurality of three-terminal, dual-mode ceramic filter elements which are connected with each other through a capacitive coupling circuit which is adapted to increase the input/output impedance of the ceramic filter.

7 Claims, 7 Drawing Figures

4,045,753

CERAMIC FILTER

BACKGROUND OF THE INVENTION

1. Field of the Invention

This invention relates to a ceramic filter comprising a plurality of three-terminal, dual-mode filter elements which are connected with each other in such a manner that the input and output impedances of the filter are increased.

2. Description of the Prior Art

There have conventionally been proposed filters comprising a plurality of three-terminal ceramic filter elements connected with each other, wherein the output terminal of one of the filter elements is connected with the input terminal of another of the filter elements, and a coupling capacitance is connected between the ground and the connection point between said output and input terminals.

However, such a conventional arrangement has such a disadvantage that limitation is laid thereupon in respect of matching with peripheral circuits due to the fact that the input and output impedances thereof are as low as about 300 to 500 $\Omega$ for the reason which will be described later.

SUMMARY OF THE INVENTION

It is an object of this invention to provide a novel and improved ceramic filter which is so designed as to represent high input and output impedances.

Another object of this invention is to provide an improved construction for such a filter, which can be easily designed and manufactured.

Other objects, features and advantages of this invention will become apparent from the following description taken in conjunction with the accompanying drawings.

DESCRIPTION OF THE PREFERRED EMBODIMENTS

Figure 1:
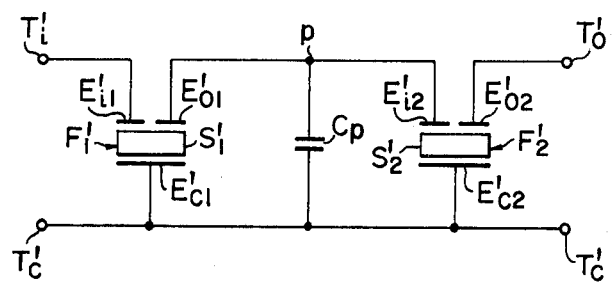
FIG. 1 is a circuit diagram showing the prior-art ceramic filter.

In FIG. 1, there is shown the prior-art ceramic filter circuit, which includes a pair of three-terminal ceramic filter elements $F_1'$ and $F_2'$. The element $F_1'$ comprises a ceramic substrate $S_1'$ having an input electrode $E_{i1}'$ and output electrode $E_{o1}'$ provided on one surface thereof and an electrode $E_{c1}'$ provided on the other surface thereof. Similarly, the other element $F_2'$ also comprises a ceramic substrate $S_2'$ having an input electrode $E_{i2}'$ and output electrode $E_{o2}'$ provided on one surface thereof and an electrode $E_{c2}'$ provided on the other surface thereof. The output electrode $E_{o1}'$ of the element $F_1'$ is connected with the input electrode $E_{i2}'$ on the other element $F_2'$, and the electrodes $E_{c1}'$ and $E_{c2}'$ of these elements are connected with each other, and grounded although not shown. A coupling capacitor $C_p$ is connected between the interconnected electrodes $E_{c1}'$, $E_{c2}'$ to be grounded and the connection point $p$ between the output electrode $E_{o1}'$ of the element $F_1'$ and the input electrode $E_{i2}'$ of the element $F_2'$. $T_i'$ and $T_o'$ indicate an input terminal and output terminal, respectively, and $T_c'$ indicates a common terminal to be grounded.

However, such a conventional ceramic filter has such a disadvantage that the input/output impedance thereof is so low that difficulties are encountered in an attempt to achieve matching of this prior-art filter circuit with peripheral circuits. This will be seen from what will be described with reference to FIG. 5 hereinafter.

Figure 2:
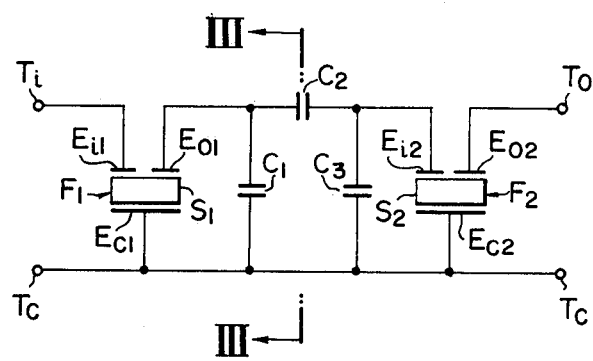
FIG. 2 is a circuit diagram showing the ceramic filter according to an embodiment of this invention.

Referring now to FIG. 2, there is illustrated the ceramic filter circuit according to an embodiment of this invention. Parts of FIG. 2 which correspond to those of FIG. 1 are indicated by similar references without dash. In this embodiment, the output electrode $E_{o1}$ of the three-terminal, dual-mode ceramic filter element $F_1$ is connected with the input electrode $E_{i2}$ of the other three-terminal, dual-mode ceramic filter element $F_2$ through a capacitor $C_2$, and the output electrode $E_{o1}$ and input electrode $E_{i2}$ are connected with the grounded electrodes $E_{c1}$ and $E_{c2}$ through capacitors $C_1$ and $C_3$, respectively. The capacitors $C_1$, $C_2$ and $C_3$ constitute a coupling circuit between the two filter elements, and although the coupling circuit is shown as a $\pi$ type circuit, it may also take the form of a T type circuit or any other desired form of circuit which is adapted to serve to increase the input/output impedance of the present filter circuit.

Figure 3:
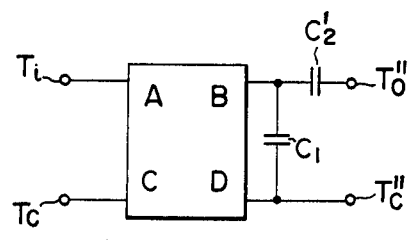
FIG. 3 is a diagram showing a four-terminal network corresponding to one half of the circuit of FIG. 2 which is taken along the line III—III.

In the case where two three-terminal, dual-mode ceramic filter elements are coupled as shown in FIG. 2, the input impedance of the resulting filter circuit can be represented by a square root of a product of the absolute value of the impedance $Z_{is}$, as seen from the input side, of such a circuit as shown in FIG. 3, which corresponds to a half of the FIG. 2 circuit, when terminals $T''_o$ and $T''_c$ are short-circuited and the absolute value of the impedance $Z_{if}$ of the FIG. 3 circuit as seen from the input side thereof when the terminals $T''_o$ and $T''_c$ are open. That is, the input impedance of the circuit of FIG. 2 can be represented by the following expression:

$$\sqrt{|Z_{is}| \cdot |Z_{if}|} \qquad (1)$$

The output impedance of the FIG. 2 circuit can also be represented by a similar expression. The aforementioned impedances $Z_{is}$ and $Z_{if}$ of the FIG. 3 circuit which corresponds to one half of the FIG. 2 circuit except that the filter element is substituted by a four-terminal circuit, are given by the following equations (2) and (3) respectively:

$$Z_{is} = \frac{B + \dfrac{A + j\omega C_1 \cdot B}{j\omega C_2}}{D + \dfrac{C + j\omega C_1 \cdot D}{j\omega C_2}} \qquad (2)$$

(3)

Figure 4:
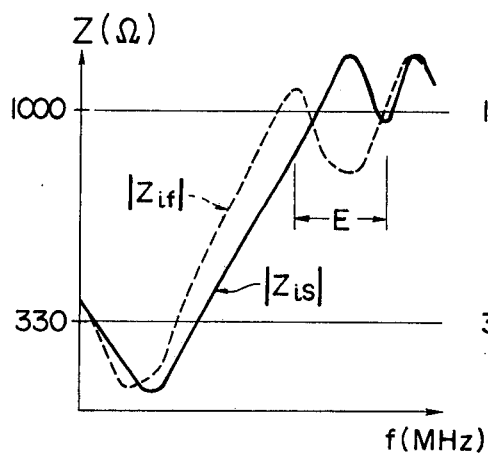
FIG. 4 is a view showing the impedance characteristics of the ceramic filter embodying this invention.

-continued
$$Z_{if} = \frac{A + j\omega C_1 \cdot B}{C + j\omega C_1 \cdot D}$$

where A, B, C and D represent the four-terminal constants, respectively, and $C_2'$ represents a half of the capacitor $C_2$ shown in FIG. 2. It will readily be apparent to those skilled in the art that the above equations will also hold true with respect to the other half of the circuit shown in FIG. 2. By changing $C_1$ from zero (0) to infinity ($\infty$), $Z_{if}$ will be changed from A/C (when $C_1 = 0$) to B/D (when $C_1 = \infty$), and by changing $C_2'$ from zero to infinity, $Z_{is}$ will be changed from A/C ($C_2' = 0$) to B/D (when $C_2' = \infty$). From this, it will be appreciated that $Z_{is}$ and $Z_{if}$ can be varied in a wide range depending upon the values of $C_1$ and $C_2'$ respectively. Thus, in accordance with this invention, the input/output impedance of the ceramic filter can be increased by suitably selecting the values of $C_1$, $C_2$ and $C_3$. For example, with $C_1 = C_2 = C_3 = 10$ pF, the absolute values of the impedances $Z_{is}$ and $Z_{if}$ will vary with frequency as shown in FIG. 4. According to the image parameter method, for example, the passband of the present filter is as shown by E in FIG. 4 wherein the two curves are sloped in opposite directions. Thus, in accordance with this embodiment of the invention, it is possible to obtain a ceramic filter having an input/output impedance which is as high as about 1000 Ω as will be appreciated from the aforementioned expression (1) and FIG. 4.

Figure 5:
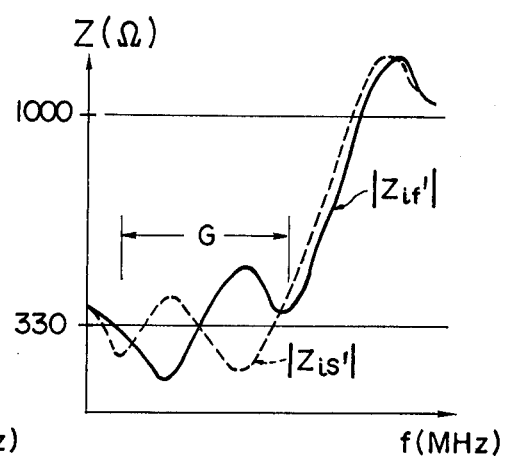
FIG. 5 is a view showing the impedance characteristics of such a conventional ceramic filter as shown in FIG. 1.

In the case of the prior-art ceramic filter circuit shown in FIG. 1, on the other hand, the impedance $Z_{is}'$, is seen from the input side, of one half thereof when the output terminals of such a half are short-circuited and the impedance $Z_{if}'$ when the output terminals are open, are given by the following equations, respectively:

$$Z_{is}' = B/D \qquad (4)$$

$$Z_{if}' = A + j\omega C_1 \cdot B/C + j\omega C_1 \cdot D \qquad (5)$$

where $C_1 = C_p/2$, and A, B, C and D are the four-terminal constants of the network corresponding to one half of the FIG. 1 circuit. It will be noted that neither of these equations contains the capacitance $C_2'$ which is contained in the foregoing equation (2), and that the impedance $Z_{is}'$ is B/D, which is constant. Thus, by changing $C_1$ from zero (0) to infinity ($\infty$), only the impedance $Z_{if}'$ will be changed from A/C to B/D. FIG. 5 shows how the absolute values of these impedances $Z_{is}'$ and $Z_{if}'$ will vary with frequency, from which it will be seen that the pass-band of the prior-art filter shown in FIG. 1 is as shown by G in FIG. 5, according to the image parameter method, and that the input/output impedance of the prior-art filter is as low as about 330 Ω.

Figure 6:
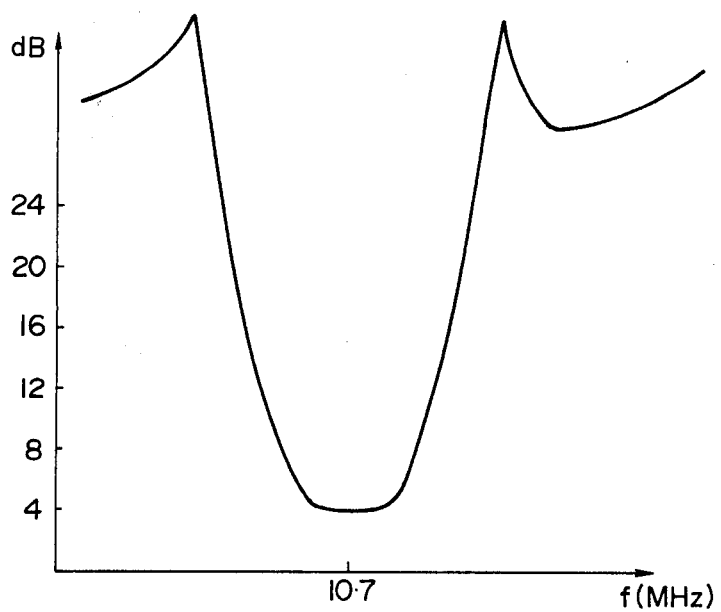
FIG. 6 is a view showing the filter characteristic of the device embodying this invention which has such impedance characteristics as shown in FIG. 4.

Referring to FIG. 6, there is illustrated the filter characteristic of the FIG. 2 circuit according to this invention which has the characteristics shown in FIG. 4. In this case, the input/output impedance of the present filter circuit was about 1000 Ω as mentioned earlier.

Figure 7:
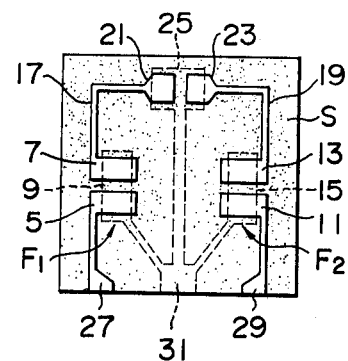
FIG. 7 is a schematic plan view showing an example of the construction of the ceramic filter device according to this invention.

In practice, the present ceramic filter described above with reference to FIG. 2 may be constructed as shown in FIG. 7. In this embodiment, a pair of electrodes 5 and 7 are provided on one surface of a ceramic substrate S in spaced, juxtaposed relationship with each other, and another pair of electrodes 11 and 13 are also provided thereon in similar relationship with each other. On the other surface of the ceramic substrate S are provided additional electrodes 9 and 15 in opposing relationship with the foregoing two electrode pairs, respectively. In this case, at least those portions of the ceramic substrate S on which the electrodes 5, 7, 9 and 11, 13, 15 are provided, are polarized in such a manner as well known in the art. Thus, two three-terminal, dual-mode ceramic filter elements $F_1$ and $F_2$ are formed by the electrodes 5, 7, 9 and 11, 13, 15, together with the polarized portions of the ceramic substrate S, respectively, wherein the electrodes 5 and 7 correspond to the electrodes $E_{i1}$ and $E_{o1}$ of FIG. 2, respectively, the electrodes 11 and 13 correspond to the electrodes $E_{o2}$ and $E_{i2}$ of FIG. 2, respectively, and the electrodes 9 and 15 correspond to the electrodes $E_{c1}$ and $E_{c2}$ of FIG. 2, respectively. Furthermore, still another pair of electrodes 21 and 23 are provided on said one surface of the ceramic substrate S in spaced, juxtaposed relationship with each other, and an opposed electrode 25 is provided on said other surface of the ceramic substrate S in opposing relationship with the electrodes 21 and 23. As will readily be apparent to those skilled in the art, the electrodes 21 and 23 constitute a capacitor corresponding to $C_2$ of FIG. 2; the electrodes 21 and 25 constitute a capacitor corresponding to $C_1$ of FIG. 2; and the electrodes 23 and 25 constitute a capacitor corresponding to $C_3$ of FIG. 2. Still furthermore, the electrode 7 corresponding to the output electrode $E_{o1}$ of the filter element $F_1$ is connected with the electrode 21 through a conductor 17, and the electrode 13 corresponding to the input electrode $E_{i2}$ of the filter element $F_2$ is connected with the electrode 23 through a conductor 19; thus the output electrode of the filter element $F_1$ is coupled to the input electrode of the other filter element $F_2$ through the capacitor formed by the electrodes 21 and 23, as is the case with the circuit shown in FIG. 2. Terminals 27 and 29 led out of the electrodes 5 and 11 correspond to the input and output terminals $T_i$ and $T_o$ of FIG. 2, respectively, and a terminal 31 with which the electrodes 9, 15 and 25 are connected, correspond to the common terminal $T_c$ of FIG. 2, which is to be grounded as described above.

According to the construction shown in FIG. 7, the three capacitors $C_1$, $C_2$ and $C_3$ which constitute the coupling circuit mentioned above with reference to FIG. 2 can be defined in a small region of the ceramic substrate S, so that the latter may also be small correspondingly, and it is only that portion of the substrate where the electrodes 21, 23 and 25 are provided that should remain non-polarized. Thus, the design and manufacture of the present filter can be facilitated, and miniaturization thereof can be achieved. In addition, in the case where the electrodes 21, 23 and 25 constitute a $\pi$ type coupling circuit as in the illustrated embodiment, the symmetry thereof can be improved. All the foregoing electrodes, conductors and terminals may be provided in predetermined patterns on the ceramic substrate as in the case of an integrated circuit.

Although, in the foregoing, description has been made of the case where the two filter elements are formed in the single common ceramic substrate, it is also possible that these filter elements may be formed in separate two ceramic substrates respectively.

While this invention has been described with respect to the case where two filter elements are connected in cascade with each other, it is to be understood that this invention can equally be applied to the cases where more than two filter elements are employed, and that various changes and modifications to the above-described embodiments will become possible without departing from the spirit and scope of this invention.

I claim:

1. A ceramic filter including at least two three-terminal, dual-mode ceramic filter elements each having an input and an output and a ground connection, and a capacitive coupling circuit comprising first capacitive means connected between the input of one of said filter elements and the output of the other of said filter elements and second capacitive means connected between said first capacitive means and the respective ground connection.

2. A ceramic filter as set forth in claim 1, wherein said filter elements and said capacitive coupling circuit comprise electrodes provided on a common single ceramic substrate, at least those portions of said ceramic substrate where said filter elements are provided being polarized, with the portion of said ceramic substrate where said capacitive coupling circuit is provided being non-polarized.

3. A ceramic filter as set forth in claim 2, wherein said electrodes are provided in predetermined patterns on said ceramic substrate.

4. A ceramic filter as set forth in claim 3, wherein the electrodes of each of said filter elements include input and output electrodes provided on one surface of said ceramic substrate in spaced, juxtaposed relationship with each other and a third electrode provided on the other surface of said ceramic substrate in opposing relationship with said input and output electrodes, and said electrodes of the capacitors constituting said capacitive coupling circuit include a pair of electrodes provided on said one surface of said ceramic filter in spaced, juxtaposed relationship with each other and a common electrode provided on said other surface of said ceramic substrate in opposing relationship with said pair of electrodes, one of said pair of electrodes being connected with the input electrode of one of said filter elements, the other of said pair of electrodes being connected with the output electrode of the other filter element.

5. A ceramic filter as set forth in claim 1, wherein each of said filter elements comprises a separate ceramic substrate which is polarized, input and output electrodes provided on one surface of said separate ceramic substrate in spaced, juxtaposed relationship with each other, and a common electrode provided on the other surface thereof in opposing relationship with said input and output electrodes.

6. A ceramic filter as set forth in claim 1, wherein said first capacitive means and said second capacitive means a are connected so as to form a $\pi$ type circuit.

7. A ceramic filter as set forth in claim 1, wherein said first capacitive means and said second capacitive means are connected so as to form a T type circuit.

* * * * *